United States Patent
Lesso (10) Patent No.: US 10,193,561 B2
(45) Date of Patent: Jan. 29, 2019

(54) PHASE LOCKED LOOPS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/384,861

(22) Filed: Dec. 20, 2016

(65) Prior Publication Data

US 2017/0187383 A1    Jun. 29, 2017

Related U.S. Application Data

(60) Provisional application No. 62/387,228, filed on Dec. 23, 2015.

(30) Foreign Application Priority Data

Jan. 29, 2016    (GB) .................................. 1601724.6

(51) Int. Cl.
    *H03L 7/06*    (2006.01)
    *H03L 7/091*   (2006.01)
    (Continued)

(52) U.S. Cl.
    CPC .............. *H03L 7/091* (2013.01); *H03L 7/085* (2013.01); *H03L 7/0891* (2013.01); *H03L 7/099* (2013.01); *H03L 7/0995* (2013.01); *H03L 7/181* (2013.01)

(58) Field of Classification Search
    CPC ...................................................... H03L 7/091
    See application file for complete search history.

(56) References Cited

U.S. PATENT DOCUMENTS 8,098,085 B2 *  1/2012  Wang ................... G04F 10/005
                                                  327/8
8,390,347 B1 *  3/2013  Sinha ..................... H03L 7/085
                                                  327/147

(Continued)

OTHER PUBLICATIONS

Combined Search and Examination Report under Sections 17 and 18(3), Application No. GB1601724.6, dated Jul. 8, 2016, 8 pages.

*Primary Examiner* — Daniel Puentes
(74) *Attorney, Agent, or Firm* — Jackson Walker L.L.P.

(57) ABSTRACT

This application relates to methods and apparatus for phase locked loops. A phase-and-frequency detector (101) receives a reference clock signal ($CK_{ref}$) and a feedback signal ($S_{FB}$) and outputs a first adjustment signal (U) that is modulated between respective first and second signal levels to provide control pulses indicating that an increase in frequency required for phase and frequency lock, and a second adjustment signal (D) that is modulated between respective first and second signal levels to provide control pulses indicating that a decrease in frequency required for phase and frequency lock. First and second time-to-digital converters (201-1 and 201-2) receive the first and second adjustment signals respectively and output respective first and second digital signals indicative of the duration of said control pulses. Each time-to-digital converter comprises a controlled-oscillator (401, 801) configured so as to operate at a first frequency when the respective adjustment signal is at the first signal level and operate at a second frequency when the respective adjustment signal is at the second signal level and a counter (403) configured to produce a count value of the number oscillations of the controlled-oscillator in each of a succession of count periods defined by a count clock signal. The first and second digital signals are based on the count values output from the respective counters. The difference between the first and second digital signals may be (Continued)

determined and input to digital loop filter (203) before driving numerically-controlled-oscillator (204) to produce the output signal.

20 Claims, 5 Drawing Sheets

(51) Int. Cl.
    *H03L 7/099*     (2006.01)
    *H03L 7/181*     (2006.01)
    *H03L 7/085*     (2006.01)
    *H03L 7/089*     (2006.01)

(56) References Cited

U.S. PATENT DOCUMENTS

| | | |
|---|---|---|
| 2004/0189407 A1 | 9/2004 | Manna et al. |
| 2006/0171495 A1* | 8/2006 | Youssouflan ........ H03D 13/003 375/376 |
| 2010/0117872 A1 | 5/2010 | Ek |
| 2011/0074618 A1 | 3/2011 | Henzler |

* cited by examiner

PHASE LOCKED LOOPS

FIELD OF DISCLOSURE

This application relates to methods and apparatus for implementing phase-locked-loops and especially to phase-locked-loops implemented using digital components.

BACKGROUND

Figure 1:
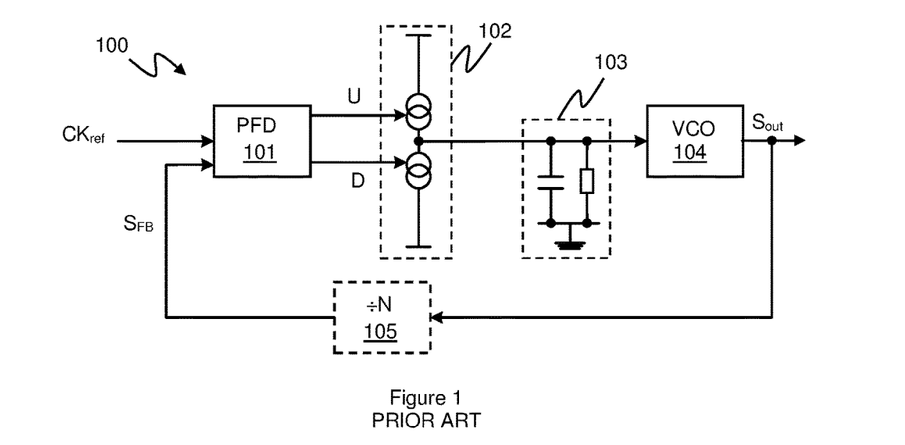
FIG. 1 illustrates a conventional Phase-Locked-Loop (PLL)

Phase-locked-loops (PLLs) are useful in a variety of applications and are particularly useful for frequency synthesis. FIG. 1 illustrates a conventional PLL such as may be used for frequency synthesis. A phase-and-frequency detector (PFD) receives a reference clock signal $CK_{ref}$ at a defined frequency $F_{ref}$ and also a feedback signal, $S_{FB}$, which is derived from the output of the PLL and which thus has a frequency $F_{FB}$ related to the output of the PLL. The PFD generates adjustment signals for controlling a charge pump 102. The adjustment signals are generally referred to as up and down signals, U and D, as they generally result in steering the frequency of the PLL upwards or downwards respectively. The output of the charge pump 102 is smoothed by a loop filter 103 and the resultant voltage drives a voltage-controlled-oscillator (VCO) 104, which generates the output signal, $S_{out}$, from which the feedback signal $S_{FB}$ is derived.

If the edges, i.e. signal transitions, of the feedback signal, $S_{FB}$, are lagging behind corresponding edges of the reference clock signal $CK_{ref}$, then control pulses are generated in the up signal to provide positive current pulses at the current output from the charge pump, and hence increase the filtered voltage received by the VCO and provide upwards frequency steering. Likewise if edges of the feedback signal, $S_{FB}$, are appearing in advance of corresponding edges of the reference signal $CK_{ref}$, then control pulses generated in the down signal D to provide downwards frequency steering in a similar but opposite manner. When the frequency of the feedback signal is close to the reference frequency the control pulses of the up or down signals will have a pulse width, i.e. a duration, related to the extent to which the feedback signal lags or leads the reference clock signal $CK_{ref}$ respectively, i.e. the phase difference between the feedback signal versus the reference clock signal. The overall result is convergence to a phase lock of the reference clock signal and the feedback signal and thus also a frequency lock.

The output signal $S_{out}$ from the VCO 104 may be input into a frequency divider 105 which may be operated to provide a selected divide by N function. The output from the frequency divider 105 is used as the feedback signal $S_{FB}$. In this way an output signal $S_{out}$ with a frequency $F_{out}$ that is a selected integer multiple N of the frequency $F_{ref}$ of the reference clock signal $CK_{ref}$ can be synthesised by selecting the suitable divisor N for the frequency divider.

In a conventional PLL such as illustrated in FIG. 1 the components of the charge pump 102 and loop filter 103 are analogue, for instance the charge pump may comprise current sources and the loop filter may be a resistor-capacitor filter. Such analogue components can require significant area of a semiconductor die in an integrated circuit implementation, with a resulting impact in size and thus cost of the PLL.

All-digital PLLs have been proposed where the functionality of the PFD and charge pump is effectively replaced by a Time-to-Digital Converter (TDC). The TDC receives a feedback signal of the output from the PLL and basically counts the number of cycles of a fast system clock to provide a digital value indicative of the pulse width or duration being output from the PLL. This allows digital filtering and processing and a digitally-controlled-oscillator (DCO) can be used to provide the output signal $S_{out}$. In such an approach however the accuracy of measurement of the frequency $F_{FB}$ of the feedback signal depends on the speed of the fast system clock. A relatively slow system clock leads to relatively high quantisation error. A very fast system clock is thus required to provide acceptable performance but a fast system clock adds to the power consumption, which may be a significant issue especially for circuits intended for battery powered devices and there are technical challenges associated with counters running with very fast clocks.

SUMMARY

Embodiments of the present invention relate to methods and apparatus for PLLs and components thereof.

According to one aspect of the present invention there is provided a phase-locked-loop apparatus comprising:
  a phase-and-frequency detector configured to:
    receive a reference clock signal and a feedback signal; and
    output first adjustment signal that is modulated between respective first and second signal levels to provide control pulses indicating that an increase in frequency required for phase and frequency lock, and
    output a second adjustment signal that is modulated between respective first and second signal levels to provide control pulses indicating that a decrease in frequency required for phase and frequency lock; and
  first and second time-to-digital converters configured to respectively receive the first and second adjustment signals respectively and output respective first and second digital signals indicative of the duration of said control pulses;
  wherein each time-to-digital converter comprises:
    a controlled-oscillator configured so as to operate at a first frequency when the respective adjustment signal is at the first signal level and operate at a second frequency when the respective adjustment signal is at the second signal level; and
    a counter configured to produce a count value of the number oscillations of the controlled-oscillator in each of a succession of count periods defined by a count clock signal; and
  wherein said first and second digital signals are based on the count values output from the respective counters.

Each time-to-digital converter may further comprise circuitry configured to receive and combine the count values from the counter over a plurality of count periods and produce the respective first or second digital signal at a sample rate which is slower than the count clock signal.

Each time-to-digital converter may further comprise circuitry configured to normalise the count values from one or more count periods to a predetermined range.

In some embodiments the count clock signal may be derived from the reference clock signal.

Each time-to-digital converter may further comprise a controller for receiving the respective adjustment signal and generating a control signal for the controlled oscillator based on the adjustment signal.

In some embodiments the controlled oscillator of each time-to-digital converter comprises a voltage-controlledoscillator. In which case the controller may be configured to connect the voltage-controlled-oscillator to a first defined voltage when the adjustment signal is at the first signal level and connect the voltage-controlled-oscillator to a second defined voltage when the respective adjustment signal is at the second signal level. The voltage-controlled-oscillator of each time-to-digital converter may comprise a ring oscillator. The ring oscillator may comprise a series of inverters.

In some embodiments at least one of the inverters may comprise at least one transistor configured to receive a control voltage which varies with the signal level of the respective adjustment signal so as to vary a delay time of said inverter, wherein the transistor is configured such that the control voltage is received at a bulk terminal of the transistor which is not directly coupled to the source or drain terminals of the transistor. The at least one inverter may be configured to receive a supply voltage of less than 0.5V. The voltage-controlled-oscillator may be configured as a bulk driven voltage-controlled-oscillator.

In some embodiments the controlled oscillator of each time-to-digital converter may comprise a current-controlled-oscillator. In which case the controller may be configured to selectively connect the current-controlled-oscillator to a first current source based on the adjustment signal.

In some embodiments the phase-and-frequency detector may comprise: first and second outputs for outputting the first and second adjustment signals respectively; a first latch configured to receive the reference clock signal and latch the first output to the first signal level at an instance of a predetermined transition in the reference clock signal and to remain at said first signal level until reset; a second latch configured to receive the feedback signal and latch the second output to the first signal level at an instance of a predetermined transition in the feedback signal and to remain at said first signal level until reset; and a reset element configured to reset the first and second latches when the first and second outputs are both at the first signal level.

The phase-locked-loop apparatus may further comprise a numerically controlled oscillator and a digital processing block, wherein the digital processing block is configured to receive the first and second digital signals and control the numerically controlled oscillator based on the first and second digital signals. The digital processing block may comprise a first digital combiner configured to combine the first and second digital signals to generate a difference signal based on the difference between the first and second digital signals. The digital processing block may comprise a second digital combiner configured to combine the first and second digital signals to generate a common mode output based on the sum of the first and second digital signals. The digital processing block may comprise a digital filter configured to filter the difference signal and wherein the numerically controlled oscillator is controlled based on the filtered difference signal. The numerically controlled oscillator may comprise a digital-to-analogue converter configured to receive a signal from the digital processing block and a voltage controlled oscillator driven by the output of the digital-to-analogue converter.

The numerically controlled oscillator may comprise a ring oscillator with one or more variable capacitances connected between stages of the ring oscillator, wherein the variable capacitances are configured to be varied based on a signal from the digital processing block. The numerically controlled oscillator may comprise a bulk-driven oscillator.

In some embodiments a frequency divider may be configured to apply frequency division to the output of the numerically controlled oscillator to generate the feedback signal. A sigma-delta modulator may be configured to dither a divider control value supplied to the frequency divider so as to control the frequency division applied.

The phase-locked-loop apparatus may be implemented as an integrated circuit. A frequency synthesiser may comprise a phase-locked-loop apparatus as described in any of the variants above.

Aspects also relate to an electronic device comprising a phase-locked-loop apparatus as claimed described in any of the variants above. The device may be at least one of: a portable device; a battery power device; a computing device; a communications device; a gaming device; a mobile telephone; a personal media player; a laptop, tablet or notebook computing device; a wearable device; or a voice activated device.

In another aspect there is a provided a method of operating a phase-locked loop comprising:
  receiving a reference clock signal and a feedback signal;
  generating a first adjustment signal that is modulated
    between respective first and second signal levels to
    provide control pulses indicating that an increase in
    frequency required for phase and frequency lock,
  generating a second adjustment signal that is modulated
    between respective first and second signal levels to
    provide control pulses indicating that a decrease in
    frequency required for phase and frequency lock; and
for each of said first and second adjustment signals:
  operating a controlled oscillator at a first frequency when
    the respective adjustment signal is at the first signal
    level and at a second frequency when the respective
    adjustment signal is at the second signal level; and
  producing a count value of the number oscillations of the
    controlled-oscillator in each of a succession of count
    periods defined by a count clock signal; and
  outputting respective first and second digital signals
    indicative of the duration of said control pulses the
    respective first and second adjustment signals wherein
    said first and second digital signals are based on the
    count values output from the respective counters.

In a further aspect there is provided a phase-locked-loop comprising:
  an input for receiving a reference clock signal;
  an output for outputting an output signal;
  a phase-and-frequency detector configured to receive the
    reference clock signal and a feedback signal derived
    from the output signal and generate control pulses at an
    first adjustment output to increase the frequency of the
    output signal and to generate control pulses at a second
    adjustment output to decrease the frequency of the
    output signal;
  first and second time-to-digital converters coupled to the
    first and second adjustment outputs respectively, each
    time-to-digital converter comprising a controlled oscillator configured to operate at a first frequency during a
    control pulse at the respective adjustment output or
    otherwise operate at a second, different frequency and
    a counter configured to count the number of oscillations
    of the controlled-oscillator and output a digital signal
    based on said count value;
  a combiner configured to receive the digital signals output
    from the first and second time-to-digital converters and
    determine a digital difference signal;
  a digital filter configured to filter the digital difference
    signal; and
  a numerically-controlled-oscillator configured to be controlled by the filtered digital difference signal to output
    the output signal.

The phase-locked-loop according to this aspect may further comprise a frequency divider configured to receive the output signal and output a frequency divided version as the feedback signal.

In a further aspect there is provided a phase-locked loop apparatus comprising: first and second time-to-digital converters configured to receive up and down adjustment signals respectively from a phase-and-frequency detector; wherein each time-to-digital converter comprises a controlled-oscillator configured to be controlled by the signal level of the respective adjustment signal.

In a further aspect there is provided a phase-locked loop apparatus comprising: first and second time-to-digital converters configured to receive up and down adjustment signals respectively from a phase-and-frequency detector; wherein each time-to-digital converter comprises a controlled-oscillator configured to be controlled by the signal level of the respective adjustment signal; wherein each said controlled-oscillator is configured to be controlled to operate at one or other of two oscillation frequencies by the signal level of the respective adjustment signal.

In a further aspect there is provided a time-to-digital converter comprising: a ring oscillator comprising a plurality of inverter stages connected in series; wherein at least one of said inverter comprises at least one transistor configured to receive a variable control voltage so as to vary a delay time of said inverter, wherein said transistor is configured such that the control voltage is received at a bulk terminal of the transistor which bulk terminal is not directly coupled to the source or drain terminals of the transistor.

BRIEF DESCRIPTION OF THE DRAWINGS

Various features of certain inventive aspects will now be described by way of example only with reference to the accompanying drawings, of which.

DETAILED DESCRIPTION

Embodiments of this disclosure relate to phased-locked-loops (PLLs), and components thereof. In one embodiment a PLL comprises a phase-and-frequency detector which receives a reference frequency signal and a feedback signal and outputs first and second adjustment signals, e.g. up and down signals. First and second time-to-digital converters are configured to receive the first and second adjustment signals respectively and output respective first and second digital signals indicative of the duration of control pulses of the first and second adjustment signals. Each time-to-digital converter comprises a controlled oscillator, for example a voltage-controlled-oscillator or current-controlled oscillator, with the frequency of operation of the controlled oscillator being controlled by relevant adjustment signal, and a counter configured to produce a count value of the number oscillations of the controlled-oscillator in each of a succession of count periods defined by a count clock signal.

Figure 2:
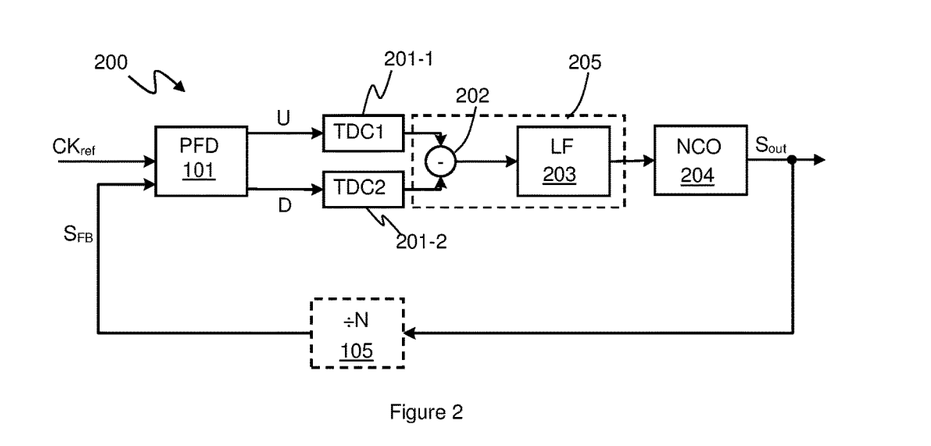
FIG. 2 illustrates a PLL according to an embodiment.

FIG. 2 illustrates a PLL 200 according to an embodiment. A phase-and-frequency detector (PFD) 101 receives a reference clock signal $CK_{ref}$ at a defined reference frequency $F_{ref}$ and also a feedback signal $S_{FB}$ derived from the output of the PLL, and thus having a frequency $F_{FB}$ related to the frequency $F_{out}$ of the output signal $S_{out}$ of the PLL. The PFD may be a conventional PFD and may generate first and second adjustment signals, which may be up and down adjustment signals U and D, in a similar fashion as discussed above.

The up and down signals are pulsed control signals where the duration of the control pulses on the relevant signal line U or D encode the extent to which signal transitions in the output signal needs to occur later or sooner. In other words the up signal is modulated between first and second signal levels to provide control pulses for controlling any increase in frequency required for phase lock and the down signal is modulated between first and second signal levels to provide control pulses for controlling any decrease in frequency required for phase lock. As one skilled in the art will appreciated the control pulses of the up and down signal lines provide signals that, over several cycles, can be used for appropriate frequency steering of a controlled oscillator to achieve frequency lock and thus the up and down signals can be seen as adjustment signals that are indicative, at least over time, of the amount of any frequency adjustment required, i.e. to achieve phase and frequency lock.

In the PLL 200 of the embodiment of FIG. 2 each of the up and down signals is thus received by a respective one of first and second time-to-digital converters (TDCs) 201-1 and 201-2. The first TDC 201-1 receives the up signal U and derives a digital value based on the duration of the control pulses of the up signal. Likewise the second TDC 201-2 receives the down signal D and derives a digital value indicative of the duration of the control pulses of the down signal.

In the embodiment of FIG. 2 the difference between these digital values is taken, for example by digital combiner 202 arranged as a subtractor, and the resulting difference signal is filtered by a digital loop filter 203. The filtered difference signal is used to control a numerically controlled oscillator (NCO) 204 to generate the output signal $S_{out}$ of frequency $F_{out}$. As like a conventional PLL in some embodiments the output signal may be divided by a specified divisor N by frequency divider 105 to provide the feedback signal $S_{FB}$ at a divided frequency $F_{FB}$.

The embodiment of FIG. 2 thus retains the functionality of the PFD of a conventional PLL but uses two TDCs to receive the respective up and down signals generated by the PFD and convert these to digital representations.

In embodiments of the present invention each of TDCs 201-1 and 201-2 comprises a controlled oscillator which controllably varies the frequency of operation based on the input signal, i.e. the respective up or down adjustment signal U or D as appropriate, and a counter arranged to count the output of the controlled oscillator during a defined count period. Whilst the count period of the counter is defined by a suitable clock signal the frequency of operation of the controlled oscillator is controlled based on the state of the relevant adjustment signal and may be free to vary at any time that the state of the relevant adjustment signal varies and will, in the absence of any change in adjustment signal, continue with its then present operation from one count period to the next. As will be described in more detail below the use of such a controlled oscillator based TDC avoids the quantisation error problems associated with other types of TDC.

The use of two such TDCs together with a PFD thus provides rapid and accurate convergence of the feedback signal to the reference frequency. The use of TDCs to provide a digital representation of the up and down signals advantageously avoids the needs for large analogue components such as a current source for a charge pump and resistors and capacitors for a loop filter, instead providing digital values indicative of the state of the up and down signals that can be easily subtracted and thus allowing the loop filter to be implemented as a digital filter.

As mentioned above the PFD 101 generates two adjustment signals, up and down, where the signal level of each adjustment signal is modulated to be at a first signal level or a second signal level, i.e. high or low, so as define the control pulses. The adjustment signals are thus two level or binary signals which use a form of pulse encoding. Conveniently the first and second levels are the same for each of the adjustment signals but this does not need to be case. Likewise conveniently the control pulses are defined in the same way in each adjustment signal, e.g. a control pulse may be defined by a period of high state for each adjustment signal. However it would be possible for the control pulses in one adjustment signal to be pulses of high state whilst the control pulses of the other adjustment signal are pulses of low state and the downstream processing configured accordingly.

Figure 3A:
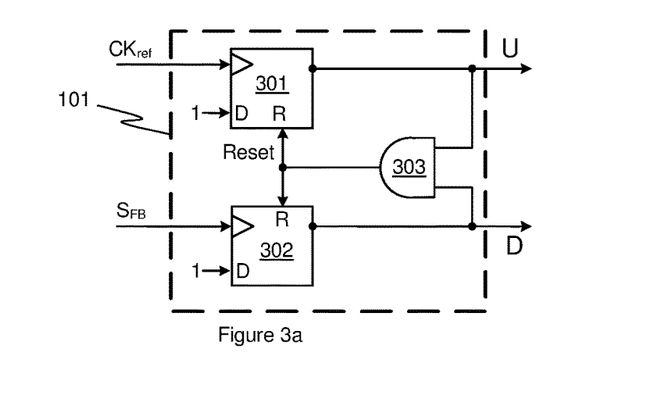
FIG. 3a illustrates an example of a phase-and-frequency detector and FIGS. 3b and 3c illustrate the operation of such a detector.

FIG. 3a illustrates one example of a suitable PFD 101. The PFD has latches 301 and 302, which in this example are edge triggered resettable D-type flip-flops that have their D input connected to logical one. Latch 301 receives the reference clock signal and outputs the up signal U. The latch 301 is configured to latch the up signal to a first signal level at an instance of a predetermined transition in the reference frequency signal, e.g. a rising clock edge. In this example the output of flip-flop latch 301 will go high at a rising edge of the reference frequency clock signal. Latch 302 receives the feedback signal and outputs the down signal D. Latch 302 is configured to latch the down signal to the first signal level at an instance of the predetermined transition in the reference frequency signal. In this example the output of flip-flop latch 302 will go high at a rising edge of the feedback signal. The outputs U and D and also input to an AND gate, which functions as a reset element 303, whose output is connected to the reset input of both flip-flops. The reset AND gate 303 will thus reset both latches 301 and 302 to the second signal state, i.e. low, when both the up and down outputs are at the first signal level.

Thus the output of each flip-flop will go high when its corresponding input goes high and will remain in that state until reset—which occurs when the output of the other flip-flop has also gone high.

Figure 3B:
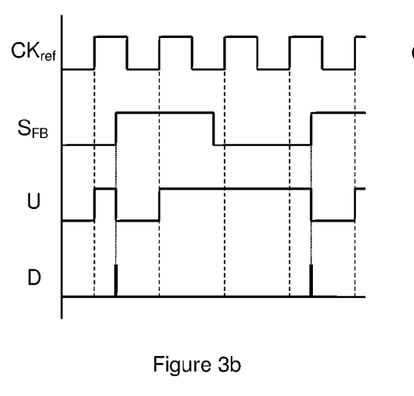
Figure 3C:
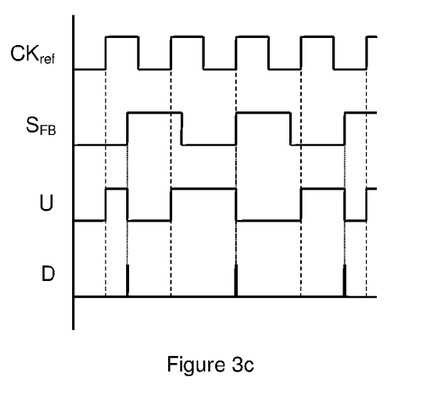

FIGS. 3b and 3c illustrate example switching waveforms. These figures illustrate an example reference clock signal $CK_{ref}$ and a feedback signal $S_{FB}$ and the resulting up and down signals U and D. In FIG. 3b the feedback signal $S_{FB}$ has a frequency which is relatively slower than the reference clock signal $CK_{ref}$. It will therefore be appreciated that flip-flop 301 providing the up signal will be latched high by the reference clock signal $CK_{ref}$ much more frequently than flip-flop 302 providing the down signal will be latched high by the feedback signal. Viewed from left to right the up signal goes high at a first rising edge of the reference clock signal $CK_{ref}$ and remains high until the rising edge of the feedback signal $S_{FB}$. At this point the down signal also goes high, meaning that both U and D are high and so the output of the AND gate resets both signals. The U signal goes low and the D signal has only a momentary spike.

At the next rising edge of the reference clock signal $CK_{ref}$ the up signal again goes high and remains high until the next rising edge of the $S_{FB}$ signal causes the down signal to also go high. Given the frequency $F_{FB}$ of the feedback signal $S_{FB}$ is relatively low (compared to the frequency $F_{ref}$ of the reference clock signal $CK_{ref}$) this may not occur until after many cycles of $CK_{ref}$, and soon after that the up signal will be reset on the next edge of $CK_{ref}$. Thus in this instance the up signal will be asserted high from time to time and the length of time spent in the high state, on average, will depend on the frequency difference between the two frequencies $F_{ref}$ and $F_{FB}$ of the input signals $CK_{ref}$ and $S_{FB}$. In other words the overall duration of all the control pulses U, D in a given period, or equivalently the proportion of time that the up signal spends high, depends on the frequency difference between the two input signals to the PFD. FIG. 3c shows the situation where the feedback signal $S_{FB}$ is still relatively slower than the reference clock signal $CK_{ref}$ but is closer in frequency to the reference clock signal $CK_{ref}$ than that of FIG. 3b. The rising edges of the feedback signal $S_{FB}$ occur more frequently, resulting in the down signal going high to reset both signals more frequently, giving shorter duration pulses of the up signal.

It can be seen from both FIGS. 3b and 3c that the duration of a control pulse of the up signal is thus defined by the time difference between a rising edge of the reference clock signal $CK_{ref}$ and a rising edge of the feedback signal $S_{FB}$, and thus, once the frequencies of the two signals are close, the pulse width of the control pulse of the up signal is indicative of any phase lag of the feedback signal $S_{FB}$ with respect to the reference clock signal $CK_{ref}$.

It will also be appreciated that the same principles would apply if the feedback signal $S_{FB}$ were to have a frequency $F_{FB}$ greater that the frequency $F_{ref}$ of the reference clock signal $CK_{ref}$, but it would be the down signal that would be clocked to go high more frequently. Thus, in that case, it would be the down signal that would exhibit control pulses of high state with the overall duration spent in the high state indicative of the frequency difference or extent of any phase lead of the feedback signal $S_{FB}$ ahead of the reference clock signal $CK_{ref}$.

The up and down signals are input to the controlled-oscillator based TDCs 201-1 and 201-2.

Figure 4:
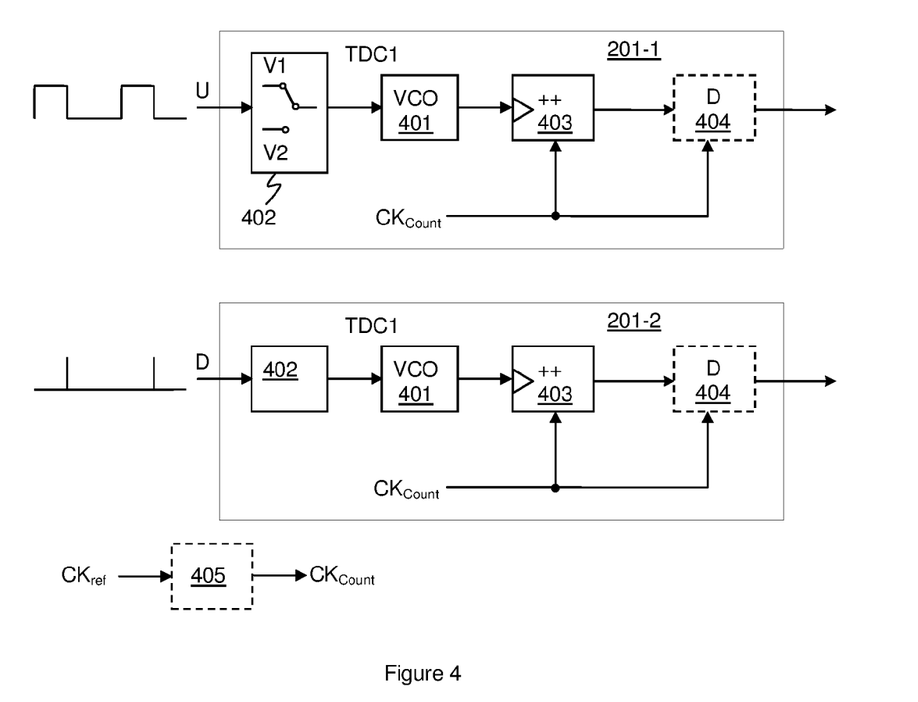
FIG. 4 illustrates examples of the time-to-digital converters of an embodiment.

FIG. 4 illustrates one example of TDCs 201-1 and 201-2 according to an embodiment. In this embodiment each TDC 201-1 and 201-2 comprises a voltage-controlled-oscillator (VCO) 401 that is controlled based on the respective input signal, U or D. As discussed above the up and down signals will vary between two different signal levels or logic states, high and low. Each VCO 401 is controlled based on the state of the adjustment signal. In some embodiments each VCO is controlled so as to generate a first frequency when the relevant adjustment signal is in the high state and to generate a second, different frequency when the relevant adjustment signal is in the low state. The first and second frequencies may both be non-zero. The output of the VCO 401 will thus vary between two frequencies $f_{high}$ and $f_{low}$ based on the signal level of its respective adjustment signal.

It should be noted that whilst the up and down adjustment signals may, in some embodiments be used directly to drive the VCO 401, the adjustment signals generated by a PFD such as described above with reference to FIG. 3a will typically be rail-to-rail digital signals as produced by the flip-flops 301 and 302. In practice such signals may not be suitable for controlling a VCO 401 directly to sufficient accuracy. Each TDC 201 may therefore comprise a controller 402 for controlling the controlled oscillator, in this example the VCO 401, in accordance with the relevant adjustment signal.

The controller may, for example, control the application of two different and predefined control voltages to the VCO 401 depending on the state of the respective adjustment signal. For example, as illustrated in FIG. 4 the controller may receive two defined voltage levels V1 and V2 and may comprise a switch arrangement for connecting the input of the VCO 401 to either V1 or V2 depending on the state of the adjustment signal. In this case the voltage to the VCO 401 still depends on the timing of the respective control pulses in the respective adjustment signals but the adjustment signals are not applied directly. In this example the controller 402 may therefore effectively translate, or level shift, the adjustment signal to a control signal having better defined voltages for controlling the VCO 401.

It will of course be appreciated that the controller or level shifter 402 is illustrated as part of TDC 201, but equally it could be considered as part of an output stage of a PFD, in which case the adjustment signals generated by such a PFD would be suitable for direct input to the VCO 401. It will also be appreciated that for other types of controlled oscillator, for instance a current-controlled-oscillator, the controller 402 would convert the adjustment signals to input currents of suitable levels.

Each TDC 201-1 and 201-2 also comprises a counter 403 which counts the number of respective oscillations of the respective output of its VCO 401 during a specified period defined by the frequency of a count clock signal $CK_{count}$ and outputs its count value.

The respective count value produced by each counter 403 during one period of the count clock signal $CK_{count}$ will depend on the duration of time that the relevant input signal U or D spends in the high state, and thus with the higher frequency VCO output $f_{high}$, compared to the low state. Each respective count value is thus related to the proportion of time spent in the high state (or equivalently the low state) during the defined count period. Each count value can be output as a digital signal.

For example if the count clock signal $F_{count}$ has a frequency of say 3 MHz for example and the high and low frequencies output from each of the VCOs 401 are 300 MHz and 100 MHz respectively then if the input adjustment signal were in the high state for the entirety of the count period this would lead to an expected average count value of 100. Were instead the input adjustment signal to spend the whole of the count period at the low state this would lead to an expected average count value of 33.3. The count value would scale linearly between these values with proportion of time spent in the high state, i.e. from 0 to 100%.

It should be appreciated that these values are given by way of example only and the high and low frequencies of the VCO 401 and the frequency count clock signal $CK_{count}$ may be chosen according to system requirements. The respective VCO output frequencies should be chosen to be sufficiently higher than the frequency $F_{ref}$ of the reference clock signal $CK_{ref}$ and the expected range of frequencies of the feedback signal $S_{FB}$ to allow useful count values to be determined. In order to reduce power consumption the frequency $F_{count}$ of the count clock signal $CK_{count}$ may be set to be relatively low but should be sufficient for the loop stability and response. The sampling rate of the counter, as set by the count frequency $F_{count}$, may for instance be arranged so that the sample rate of the loop (once converged in phase/frequency) is a suitable multiple of the PLL loop unity gain bandwidth, for instance three times or greater.

As illustrated in FIG. 4 in some embodiments the count clock signal $CK_{count}$ may be derived from the reference clock signal $CK_{ref}$ by use of a suitable divider or counter 405 that receives the reference clock signal $CK_{ref}$. It will be appreciated however that other system clocks may be available that may be used for the count clock signal $CK_{count}$ or from which the count clock signal $CK_{count}$ may be derived.

The use of controlled oscillator based TDCs avoids problems with quantisation that are inherent with at least some other types of TDC and avoids the need for fast clocks.

It would in theory be possible to use the input adjustment signal, i.e. U or D, directly to enable a counter that counts the oscillations of a fast system clock when enabled. Thus the respective counter 403 would only be enabled when the relevant signal was high. Periodically the count value would be read out and the counter reset. It will be understood however that the U or D signal may transition high or low during a clock cycle of the fast clock and thus such a counter would inherently suffer from a quantisation error.

In an embodiment of a controlled oscillator based TDC, such as the VCO based TDC illustrated in FIG. 4, it will be understood that the counter 403 in this instance counts oscillations of the output of the VCO during the count period. It is similarly the case that there is unlikely to be exactly an integer number of complete oscillations during the count period and thus in any given count period there may be what are regarded as a quantisation error due to the occurrence of only a partial cycle of the VCO output in the given count period.

However, unlike with a simple counter arrangement which would be reset and lose such information every count period, in the controlled oscillator based TDC, as illustrated in FIG. 4, the error is effectively carried over and remembered as a phase advance of the oscillation for the next count period, rather than the partial cycle being truncated and lost. The count period is clearly defined by the count clock signal $CK_{count}$ but the frequency of the controlled oscillator can vary at any time in accordance with changes to the adjustment signal and, in the absence of any variation in adjustment signal level, will maintain the same frequency from one count period to the next. Because of this feature a cumulative or average count over many cycles of the count period is relatively accurate. This quantisation error is thus first-order noise shaped to appear at higher rather than lower frequencies, in a similar fashion to a conventional first-order delta-sigma converter. In other words, while this quantisation will be apparent when observing just one sample of the counter output, the noise will average out when multiple samples are averaged.

However, if for example the D.C. level of the VCO low frequency $f_{low}$ is such that there is 1/1000 of an extra cycle every count period, then 999 count periods will give the same count, and every 1000$^{th}$ cycle will give an extra count increment. This will appear at the output as equivalent to a pulse train of say 3 MHz/1000=3 kHz, giving tones at 3 kHz and harmonics.

To avoid such effects, as is known in the general field of delta-sigma modulation, a dither signal may be added to the input of the VCO to randomise the sequence of counts, to avoid such spurious signal-band signals, and help obtain an effective resolution greater than that corresponding to the average count value. This dither signal may be generated to have relatively little power in the signal band of interest and higher power at higher frequencies, and be of amplitude of several or many LSBs of the counter output. Thus, although improving noise performance in the signal band, the dither signal will modulate the count signal such that it is no longer so accurate in any single given count period. Such error in each individual count value does not cause any quality issues in embodiments described herein as the output of the TDC 201 is filtered in any case to provide the long term steering required.

As noted above the respective count value output from each counter 403 thus provides an indication of the amount of time that the relevant input signal U or D spends in the high state during that count period and may linearly scale between a minimum count value (when the input signal is low and the VCO outputs one frequency, i.e. $f_{low}$ or $f_{high}$, for the whole count period) and a maximum count value (when the input signal is high and the VCO outputs the other frequency, i.e. $f_{high}$ or $f_{low}$, for the whole count period). In some embodiments there may be some circuitry within the counter 403, or optionally via a separate processing block 404, to re-centre, e.g. level shift, or normalise or scale, the count value to a convenient range, e.g. by use of conventional addition or multiplication circuitry. It is noted however that in the embodiment of the PLL illustrated in FIG. 2 it is the difference between the digital values output from the TDCs 201-1 and 201-2 that is of interest. In such embodiments normalising or scaling of the count values may not be required.

The two respective VCOs 401 may conveniently be configured to operate with the same high and low frequencies $f_{high}$ and $f_{low}$. Given that the count period for both counters 403 is defined using the same count frequency clock signal $F_{count}$ in such case the minimum count value should be the same for both the up and the down signal. Thus the downstream subtraction of the outputs from the two TDCs 201-1 and 201-2 may inherently remove the offset of the minimum count value.

The two respective VCOs 401 may conveniently have the same design as one another and may conveniently be physically close to one another so as to minimise the effects of any temperature induced variation affecting one VCO and not the other.

In some embodiments for higher performance or to accommodate simpler or cruder higher-tolerance designs, or to account for the increased process variation at small geometry semiconductor process nodes, it may be advantageous to compensate for any quiescent offset or gain variation in the output count value. In some instances any required offset or gain corrections to be applied may be determined in a calibration phase at end-of-line manufacturing test. Additionally or alternatively any such offset or gain corrections required could be determined on start-up or in use by continually monitoring say the lower frequency by some appropriately gated counter or suchlike. Additionally or alternatively, the analogue signal levels applied to the controlled oscillator input may be adjusted in some calibration operation at manufacturing test or on start-up or in use based on observed output frequencies. A gain or offset correction or the analogue signals levels may be designed to vary with temperature or supply voltage to vary to compensate for any temperature or supply voltage variation in the controlled oscillator characteristics.

The two VCOs may be manufactured on a common integrated circuit to provide matched voltage-to-frequency transfer characteristics and thus no quiescent offset count and a difference between respective high and low output frequencies that is predictable and small enough not to unduly impact loop stability or response.

It should be noted that in the embodiment of FIG. 4 the state of the adjustment signal controls the voltages V1 and V2 applied to the VCO 401 by controller 402 so as to generate the frequencies $f_{high}$ or $f_{low}$. In some embodiments the high state of the adjustment signal may result in the higher voltage being applied to the input of the VCO to generate the higher frequency $f_{high}$, with the low state of the adjustment signal resulting in a lower voltage being applied to generate to the lower frequency $f_{low}$. If the adjustment signals are generally low state, with control pulses of high state, this will result in the VCO running quiescently at $f_{low}$ with periods of $f_{high}$ as defined by the control pulses. In some embodiments however it may be preferred to have the VCO run quiescently at $f_{high}$ with periods of the lower frequency $f_{low}$ being defined by the width/duration of the control pulses of the relevant adjustment signal. This may consume more power but provide generally better performance. In which case the controller 402 may be arranged to provide the higher voltage V1 or V2 during periods of the low state of the adjustment signal and the lower voltage during periods of the high state or, alternatively, as mentioned above the adjustment signal may be arranged where the control pulses are pulses of low state in a usually high state signal.

As discussed above, the quantisation noise benefits of the VCO-based PFD arise from the VCO accurately accumulating phase in both high frequency and low frequency states. In principle, the low frequency state could be a zero-frequency state. In other words the oscillator would then be disabled or gated off. However accurate preservation of phase would require the VCO to remember and re-instate all its state variables (e.g. the node voltage of every circuit node) in the transition back into the high frequency state. In a practical design this is not perfectly achievable—the interruption of current paths or the resetting of node voltages to disable the oscillation would not be perfectly reversible— so some error in phase would occur at every transition. Thus it is preferable for the low frequency mode of the VCO to produce a non-zero output frequency, even if a factor of 10 or 100 or even 1000 less than the higher frequency, to reduce or practically eliminate any transients or phase accumulation errors when switching between states.

Figure 5A:
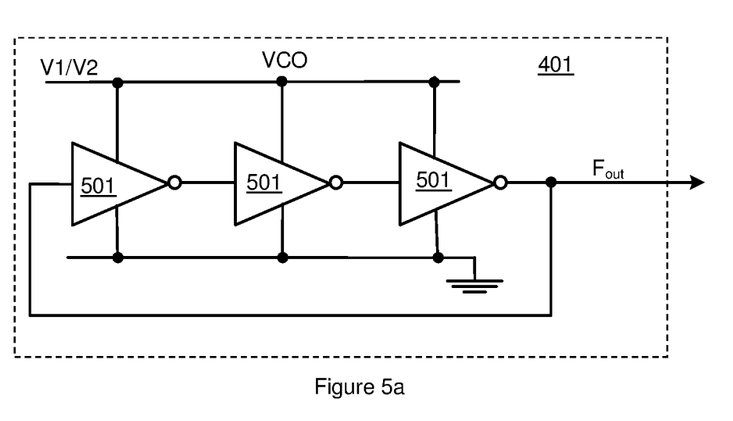
FIGS. 5a and 5b illustrate an example voltage-controller-oscillator.
Figure 5B:
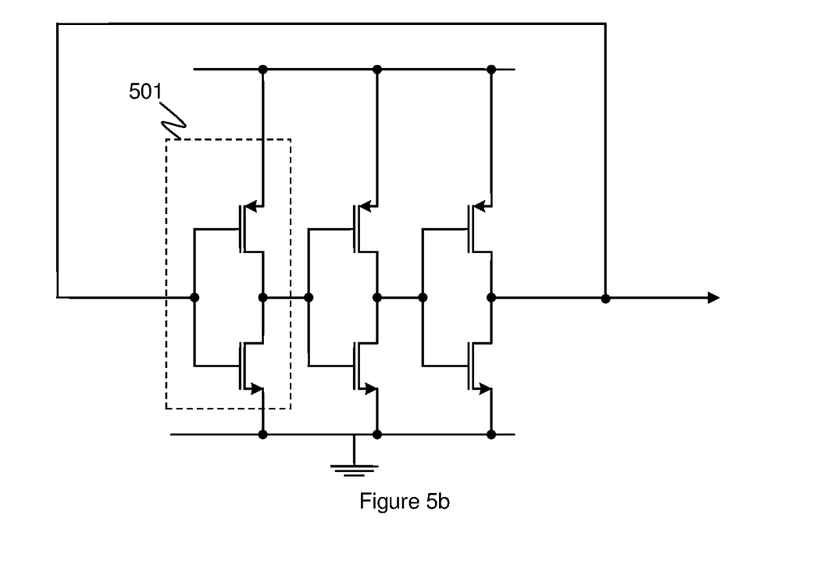

The VCOs 401 may be implemented by any suitable VCO. FIG. 5a shows one example of a suitable VCO 401. A series of an odd number of inverters 501 are arranged in series to provide a ring oscillator. The drive signal, which in this example is either of the defined voltages V1 or V2 output by controller 402, varies the high-side voltage supply to the oscillators and thus varies the delay time associated with each inverter stage 501 and hence the output frequency of the oscillator. Such a VCO 401 may be implemented as a source driven VCO 401 as illustrated in FIG. 5b showing a more detailed circuit diagram of an embodiment of the VCO illustrated in FIG. 5a.

As one skilled in the art will appreciate the bulk terminal of a MOSFET device whose source terminal is connected to a supply rail or pseudo-supply rail may typically be shorted to the source terminal. However in some circuits the bulk terminal may be connected to some other circuit node.

Figure 6:
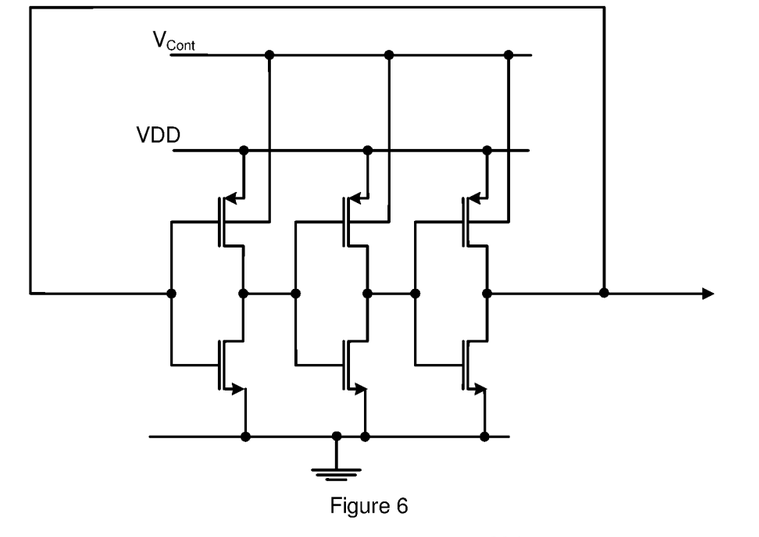
FIG. 6 illustrates a bulk-driven voltage-controlled-oscillator.

Thus in some embodiments the VCO may be bulk driven. FIG. 6 illustrates an example of a bulk driven VCO according to an embodiment. The VCO of the embodiment of FIG. 6 comprises a series of inverter stages similar to those of FIGS. 5a and 5b. However in this embodiment a driving signal $V_{Cont}$ is applied to the bulk terminal of at least one of the transistors, e.g. MOSFETs, of the inverter stages (which bulk terminal is not directly coupled to the respective source or drain terminals).

It has been appreciated that bulk driving of the MOSFETs of the inverter stages of the VCO in this way can effectively changes the threshold voltage of the MOSFETs and thus modulate the output current drive and hence the output frequency of a VCO without needing to vary the supply voltage. The power consumed by a CMOS inverter-based VCO is ideally that required to charge and discharge the capacitance on each stage through a voltage change equal to the supply voltage and is thus proportional to the square of the applied supply voltage. So for a source-driven VCO such as illustrated in FIG. 5b, the power consumed varies as the applied supply voltage is altered to vary the frequency or to produce a given frequency despite temperature or manufacturing variations. However the supply voltage of a bulk-driven VCO such as the embodiment illustrated in FIG. 6 is not altered in use, so the power consumption does not vary so much and is lower in typical conditions. (In some embodiments of a bulk-driven VCO, the supply voltage may be altered in use for example to provide extra control or compensation for manufacturing or temperature variation, but the variation in this supply voltage would be less than an equivalent purely source-driven VCO design, as at least some of the control is implemented by modulating the bulk voltage)

Also while applying an increasing reverse bias to the bulk-source junction (e.g. supplying a relatively more positive voltage to a PMOS bulk terminal) increases the threshold voltage, applying a forward bias to the bulk-source voltage reduces the threshold voltage (albeit the maximum applied forward voltage should preferably be less than a diode voltage to avoid significant diode junction current). Reducing the threshold voltage in this way allows a lower supply voltage to be used than would otherwise be the case. Additionally or alternatively, the opportunity to increase the effective threshold voltage under some conditions allows a PMOS transistor structure with a lower zero-bias threshold voltage to be used than would otherwise be desirable.

Thus the supply voltage actually used may significantly lower than the supply voltages used for conventional non-bulk driven inverters, for example 0.2V rather than 0.5V, thus reducing power consumed at a given output frequency by a factor of the order of $(0.5V/0.2V)^2 = 6.25$. The control voltage $V_{Cont}$ supplied to the bulk terminal may be relatively low, for instance varying from 0V to about 500 mV for example.

It should be noted that VCOs may display a somewhat non-linear dependence of output frequency versus input signal. However in embodiments of the present invention the VCO is provided with one or other of two input signal levels, e.g. V1 or V2, so is only required to provide two different frequencies, $f_{high}$ and $f_{low}$ and thus the linearity of response for intermediate input signal levels is not important. The count value produced by the counter 402 of the TDC, which depends on the VCO output frequency, and thus only on the two output frequencies $f_{high}$ and $f_{low}$, will scale linearly between the maximum and minimum count values as the proportion of time of the count period that the input signal U or D spends in the high state increases.

A count value output from the counter 403 may in some instances be used as the output signal from the TDC 201. However in some embodiments the TDC 201 may comprise circuitry 404 such as a decimator, or the like, for reducing the sample rate of the TDC output from that of the rate of the count clock signal $CK_{count}$. The digital output signal produced by circuitry 404 may for instance be a multi-bit PCM word at a predetermined sampling frequency which may be a relatively small multiple of the bandwidth of the loop, say 4 times or under 10 times thereof.

As described above in respect of FIG. 2 the respective digital values output by the TDCs 201-1 and 201-2 may be input to a digital processing block 205 which processes the digital signals output from the TDCs and drives the NCO 204. In the example of FIG. 2 the digital processing block 204 comprises a combiner 202 that subtracts the respective TDC output signals from one another and a digital filter 203 that filters the resultant difference value. The filtered difference signal may be used to drive the NCO 204.

The digital filter 203 may be any suitable filter that can act as a digital loop filter and may for example comprise a PID (proportional-integral-derivative) filter or just a PI filter.

Figure 7A:
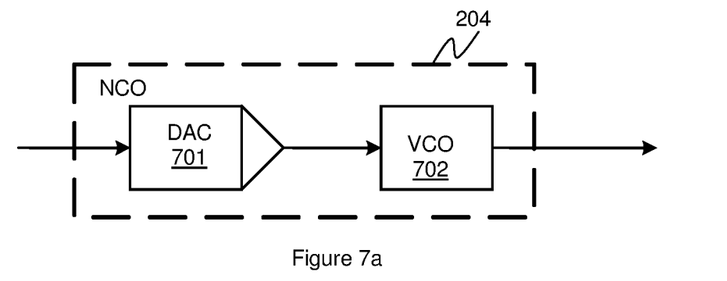
FIGS. 7a and 7b illustrate examples of numerically-controlled-oscillator.
Figure 7B:
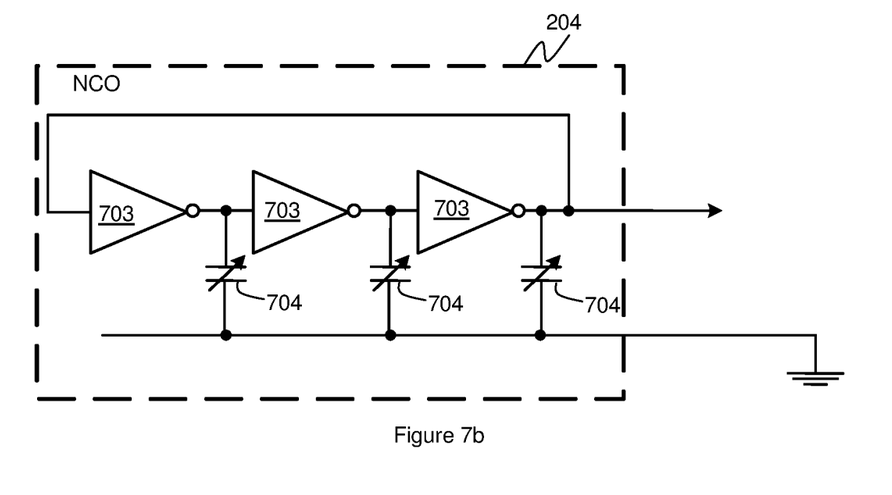

The NCO 204 may be any suitable NCO. FIG. 7a illustrates an example of a suitable NCO 204, comprising a digital-to-analogue converter (DAC) 701 and separate VCO 702. The VCO 702 may be a VCO such as described above with reference to FIGS. 5a and 5b or may be a bulk driven VCO such as described with reference to FIG. 6. FIG. 7b illustrates another example of a suitable NCO 204, with a combined DAC/VCO function. The NCO 204 of FIG. 7b comprises a series of inverters 703 arranged as a ring oscillator. Variable capacitances 704 are varied, i.e. controlled, by the digital input signal, i.e. the digital signal output from the digital filter 203 of FIG. 2, and thus speed up or slow down the inverters, thus varying the frequency of output from the ring oscillator. One skilled in the art will appreciate that other types of NCO exist and could be used in embodiments. For instance the NCO may comprise a current-controlled oscillator or a current-mode DAC.

As discussed above the PLL may comprise a divide by N frequency divider 105 in the feedback path so that the frequency $F_{out}$ of the output signal $S_{out}$ is locked to be an integer multiple of the reference frequency $F_{ref}$ of the reference clock signal $CK_{ref}$. In some embodiments however it may be preferred that the output frequency may be a multiple of the reference frequency that is not integer. This may for example allow a lower frequency clock reference signal to be used whilst still providing a desired range of selectable output frequencies, and/or provide a finer resolution of available output frequencies.

In some embodiments the PLL may be configured to be operable as a fractional mode PLL so that the output frequency is locked to a non-integer multiple of the reference frequency. A fractional-mode PLL can be implemented by effectively changing the value of N supplied to the frequency divider in a time average way, i.e. dithering a divider control value, so that the average value has the desired fractional value. For performance reasons the dithering is usually applied by a delta-sigma modulator.

Figure 8:
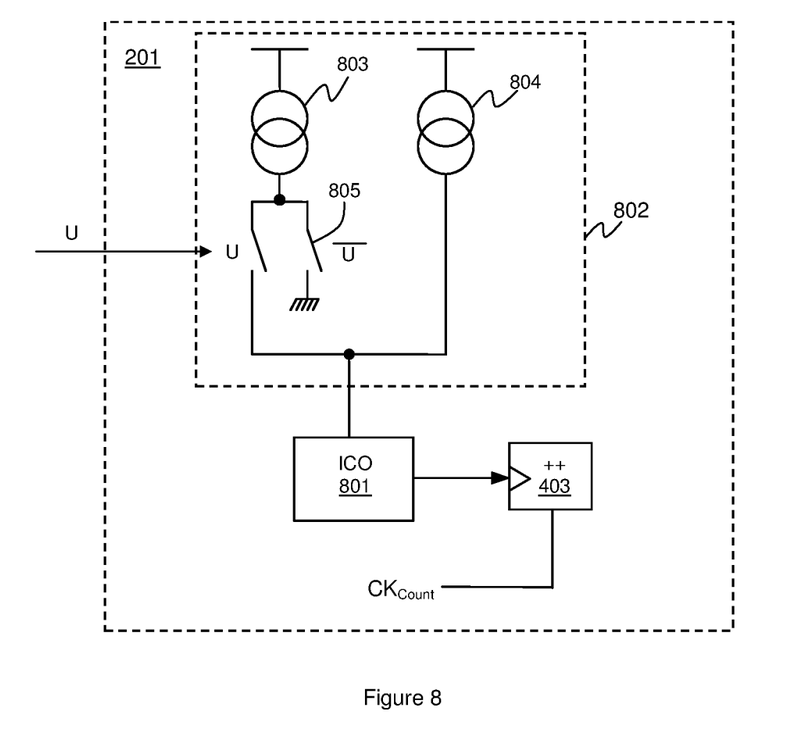
FIG. 8 illustrates an example of a time-to-digital converters according to a further embodiment.

The embodiments described above have focussed on the use of VCO based TDCs. As noted previously however any suitable controlled oscillator that may vary the output frequency based on the adjustment signal may be used in the TDC. FIG. 8 illustrates an example of a TDC based on a current-controlled-oscillator.

The TDC 201 comprises a current-controlled-oscillator (ICO) such as would be understood by one skilled in the art. A controller 802 comprises first and second current sources 803 and 804 and switch arrangement 805. The controller 802 receives the adjustment signal, U or D (U in this illustrated example) and controls the switch arrangement 805 to connect current source 803 to the input of the ICO 801 or to ground. The other current source 804 may be directly connected to the ICO input. When the adjustment signal has a first state the first current source 803 is connected to the input and the current adds to that from current source 804. This may result in a high current signal producing a high output frequency $f_{high}$. When the adjustment signal has the other signal level the first current source 803 is connected to ground (alternatively, not illustrated, it may be temporarily disabled) and only current source 804 contributes current to the input of the ICO 801, resulting in a lower output frequency $f_{low}$. The output of the ICO 801 is received by counter 403 which operates in a similar fashion as described above with reference to FIG. 4.

Some embodiments therefore provide a PLL such as can be used for frequency synthesis that is implemented using substantially all digital components. The use of a phase-and-frequency detector together with two time-to-digital converters for converting the up and down signals to digital signals allows for rapid phase and frequency convergence whilst allowing downstream digital processing to be applied, with consequential size, cost and power savings compared to the use of analogue components. The use of controlled oscillator based TDCs, for example VCO based TDCs, avoids problems with quantisation noise that are inherent in other types of TDC and thus provides high quality performance.

In addition in some embodiments the use of bulk driven components, in particular a bulk driven VCO of a TDC, allows for relatively very low power operation. Some embodiments thus provide a TDC comprising a bulk-driven VCO. Such a TDC may be used in a PLL to provide a low power PLL according to a further embodiment.

PLLs according to embodiments may be used in a variety of different applications. A PLL according to an embodiment may be implemented as an integrated circuit and may be implemented in a host device. Such PLLs being of relatively low size and possibly low power may be advantageously used in electronic devices such as portable and/or battery powered host device such as a mobile telephone, an audio player, a video player, a PDA, a mobile computing platform such as a laptop computer or tablet and/or a games device for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

The invention claimed is:

1. A phase-locked-loop apparatus comprising:
 a phase-and-frequency detector configured to:
  receive a reference clock signal and a feedback signal; and
  output first adjustment signal that is modulated between respective first and second signal levels to provide control pulses indicating that an increase in frequency required for phase and frequency lock, and
  output a second adjustment signal that is modulated between respective first and second signal levels to provide control pulses indicating that a decrease in frequency required for phase and frequency lock; and first and second time-to-digital converters configured to respectively receive the first and second adjustment signals respectively and output respective first and second digital signals indicative of the duration of said control pulses;
 wherein each time-to-digital converter comprises:
  a controlled-oscillator configured so as to operate at a first frequency when the respective adjustment signal is at the first signal level and operate at a second frequency when the respective adjustment signal is at the second signal level; and
  a counter configured to produce a count value of the number oscillations of the controlled-oscillator in each of a succession of count periods defined by a count clock signal; and
 wherein said first and second digital signals are based on the count values output from the respective counters.

2. A phase-locked-loop apparatus as claimed in claim 1 wherein each time-to-digital converter further comprises circuitry configured to receive and combine the count values from the counter over a plurality of count periods and produce the respective first or second digital signal at a sample rate which is slower than the count clock signal.

3. A phase-locked-loop apparatus as claimed in claim 1 wherein each time-to-digital converter further comprises circuitry configured to normalise the count values from one or more count periods to a predetermined range.

4. A phase-locked-loop apparatus as claimed in claim 1 wherein each time-to-digital converter further comprises a controller for receiving the respective adjustment signal and generating a control signal for the controlled oscillator based on the adjustment signal.

5. A phase-locked-loop apparatus as claimed in claim 1 wherein the controlled oscillator of each time-to-digital converter comprises a voltage-controlled-oscillator.

6. A phase-locked-loop apparatus as claimed in claim 5, wherein each time-to-digital converter further comprises a controller for receiving the respective adjustment signal and generating a control signal for the controlled oscillator based on the adjustment signal and wherein said controller is configured to connect the voltage-controlled-oscillator to a first defined voltage when the adjustment signal is at the first signal level and connect the voltage-controlled-oscillator to a second defined voltage when the respective adjustment signal is at the second signal level.

7. A phase-locked-loop apparatus as claimed in claim 5 wherein the voltage-controlled-oscillator of each time-to-digital converter comprises a ring oscillator.

8. A phase-locked-loop apparatus as claimed in claim 7 wherein the ring oscillator comprises a series of inverters and at least one of said inverters comprises at least one transistor configured to receive a control voltage which varies with the signal level of the respective adjustment signal so as to vary a delay time of said inverter, wherein said transistor is configured such that the control voltage is received at a bulk terminal of the transistor which is not directly coupled to the source or drain terminals of the transistor.

9. A phase-locked-loop apparatus as claimed in claim 8 wherein said at least one inverter is configured to receive a supply voltage of less than 0.5V.

10. A phase-locked-loop apparatus as claimed in claim 5 wherein the voltage-controlled-oscillator is configured as a bulk driven voltage-controlled-oscillator.

11. A phase-locked-loop apparatus as claimed in claim 1 wherein the controlled oscillator of each time-to-digital converter comprises a current-controlled-oscillator.

12. A phase-locked-loop apparatus as claimed in claim 1 wherein the phase-and-frequency detector comprises:
- first and second outputs for outputting the first and second adjustment signals respectively;
- a first latch configured to receive the reference clock signal and latch the first output to the first signal level at an instance of a predetermined transition in the reference clock signal and to remain at said first signal level until reset;
- a second latch configured to receive the feedback signal and latch the second output to the first signal level at an instance of a predetermined transition in the feedback signal and to remain at said first signal level until reset; and
- a reset element configured to reset the first and second latches when the first and second outputs are both at the first signal level.

13. A phase-locked-loop apparatus as claimed in claim 1 further comprising a numerically controlled oscillator and a digital processing block, wherein the digital processing block is configured to receive the first and second digital signals and control the numerically controlled oscillator based on the first and second digital signals.

14. A phase-locked-loop apparatus as claimed in claim 13 wherein the digital processing block comprises a first digital combiner configured to combine the first and second digital signals to generate a difference signal based on the difference between the first and second digital signals.

15. A phase-locked-loop apparatus as claimed in claim 14 wherein the digital processing block comprises a second digital combiner configured to combine the first and second digital signals to generate a common mode output based on the sum of the first and second digital signals.

16. A phase-locked-loop apparatus as claimed in claim 13 wherein the numerically controlled oscillator comprises a digital-to-analogue converter configured to receive a signal from the digital processing block and a voltage controlled oscillator driven by the output of the digital-to-analogue converter.

17. A phase-locked-loop apparatus as claimed in claim 13 wherein the numerically controlled oscillator comprises a ring oscillator with one or more variable capacitances connected between stages of the ring oscillator, wherein the variable capacitances are configured to be varied based on a signal from the digital processing block.

18. An electronic device comprising a phase-locked-loop apparatus as claimed in claim 1.

19. A phase-locked-loop comprising:
- an input for receiving a reference clock signal;
- an output for outputting an output signal;
- a phase-and-frequency detector configured to receive the reference clock signal and a feedback signal derived from the output signal and generate control pulses at an first adjustment output to increase the frequency of the output signal and to generate control pulses at a second adjustment output to decrease the frequency of the output signal;
- first and second time-to-digital converters coupled to the first and second adjustment outputs respectively, each time-to-digital converter comprising a controlled oscillator configured to operate at a first frequency during a control pulse at the respective adjustment output or otherwise operate at a second, different frequency and a counter configured to count the number of oscillations of the controlled-oscillator and output a digital signal based on said count value;
- a combiner configured to receive the digital signals output from the first and second time-to-digital converters and determine a digital difference signal;
- a digital filter configured to filter the digital difference signal; and
- a numerically-controlled-oscillator configured to be controlled by the filtered digital difference signal to output the output signal.

20. A phase-locked loop apparatus comprising:
- first and second time-to-digital converters configured to receive up and down adjustment signals respectively from a phase-and-frequency detector;
- wherein each time-to-digital converter comprises a controlled-oscillator configured to be controlled by the signal level of the respective adjustment signal;
- wherein each said controlled-oscillator is configured to be controlled to operate at one or other of two oscillation frequencies by the signal level of the respective adjustment signal.

* * * * *